(12) United States Patent
Zuo et al.

(10) Patent No.: US 7,459,216 B2
(45) Date of Patent: *Dec. 2, 2008

(54) POLYIMIDE COPOLYMER AND METAL LAMINATE USING THE SAME

(75) Inventors: Min Zuo, Kitaibaraki (JP); Jenq-Tain Lin, Kitaibaraki (JP)

(73) Assignee: Nippon Mektron Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/815,164

(22) Filed: Mar. 31, 2004

(65) Prior Publication Data

US 2004/0180227 A1     Sep. 16, 2004

(30) Foreign Application Priority Data

Aug. 20, 2002  (JP)  ............................. 2002-239145
Nov. 11, 2002  (JP)  ............................. 2002-326599

(51) Int. Cl.
*B32B 15/08* (2006.01)
*C08G 69/26* (2006.01)

(52) U.S. Cl. ..................................... 428/458; 528/353

(58) Field of Classification Search ................. 428/457, 428/458, 473.5, 474.4; 528/353, 128, 173, 528/350, 351
See application file for complete search history.

(56) References Cited

U.S. PATENT DOCUMENTS 4,937,133 A * 6/1990 Watanabe et al. ........... 428/209
5,290,909 A    3/1994 Chen et al.
6,489,436 B1 * 12/2002 Lin et al. ..................... 528/353
6,770,733 B2 *  8/2004 Zuo et al. .................... 528/353

FOREIGN PATENT DOCUMENTS

| JP | 43-1832 | 1/1970 |
| JP | B-4-22399 | 3/1993 |
| JP | B-5-93537 | 11/1994 |
| JP | B-7-39161 | 5/1996 |
| WO | WO 01/29136 A1 | 4/2001 |
| WO | WO 2004/018545 A1 | 4/2004 |

* cited by examiner

*Primary Examiner*—Thao T. Tran
(74) *Attorney, Agent, or Firm*—Butzel Long

(57) ABSTRACT

A novel polyimide copolymer, which is a copolymer comprising two kinds of tetracarboxylic acid dianhydrides consisting of (A) isopropylidene-bis(4-phenyleneoxy-4-phthalic acid) dianhydride and (B) 3,3',4,4'-biphenyltetracarboxylic acid dianhydride, and one kind of a diamine consisting of (C) 6-amino-2-(p-aminophenyl)benzimidazole, or two or three kinds of diamines consisting of component (C) and (D) at least one kind of diamines consisting of bis(4-amino-phenyl) ether ($D_1$) and phenylenediamine ($D_2$), and a metal laminate manufactured by laminating said polyimide copolymer to a metallic foil. The metal laminate comprising the novel polyimide copolymer as a layer on the metallic foil has a low curling susceptibility to cause curling, twisting, warping, etc. against temperature changes due to a low coefficient of linear thermal expansion of the polyimide copolymer, and also has satisfactory adhesiveness and thermal dimensional stability and a low water absorbability, and thus can be used as a suitable for a flexible, finely printed circuit board requiring a high dimensional stability.

5 Claims, No Drawings

POLYIMIDE COPOLYMER AND METAL LAMINATE USING THE SAME

TECHNICAL FIELD

The present invention relates to a novel polyimide copolymer and a metal laminate using the same, and more particularly to a novel polyimide copolymer capable of suitably using as a film for a flexible printed circuit board and a metal laminate using the same.

BACKGROUND ART

Most of substrates for flexible printed circuit boards, etc. have been so far manufactured by bonding a metallic foil and an aromatic polyimide film with an adhesive such as epoxy resin, polyurethane resin, etc. However, the flexible printed circuit boards manufactured with such an adhesive have problems such as adhesive peeling due to successive thermal compression bonding hysteresis or due to exposure to elevated temperatures in the soldering step, or smear generation in the drilling step owing to an adhesive, and further have such drawbacks as curling, twisting, warping, etc. of the substrates after cooling, causing trouble particularly to form a fine pattern.

These problems owe their origin to differences in coefficient of linear thermal expansion between a conductor and an insulating material, and thus it has been proposed to improve the heat resistance of the adhesive. Basically, omission of the adhesive layer can solve not only the problems due to the adhesive layer, but can also save the labor of bonding the adhesive to the polyimide film.

From such a viewpoint, a metal laminate has been formed in some cases by directly coating a metallic conductor with polyamic acid as a polyimide precursor copolymer, followed by heating to effect polyimidization. It is known that the metal laminate thus obtained has a poor dimensional stability and suffers from curling.

To overcome these drawbacks, JP-B-5-22399, JP-B-6-93537, JP-B-7-39161, etc. disclose metal laminates with distinguished dimensional stability, adhesiveness, flatness after etching, reduction in curling, etc., manufactured by forming a plurality layers of a polyimide resin layer having low thermal expansion and other polyimide resin layers on a conductor, where two or three kinds of polyimide precursor copolymers must be used, the individual copolymer solutions must be applied one by one to the conductor to form an insulation multilayer, and a ratio in thickness of the resulting individual polyimide layers must be specified, inevitably complicating the manufacture of the metal laminate thereby.

The present applicant has already proposed a metal laminate where one kind of polyimide copolymer layer is directly laminated to a metallic conductor (WO 01/29136). The polyimide copolymer used therein is a copolymer of isopropylidenebis(4-phenyleneoxy-4-phthalic acid) dianhydride and 6-amino-2-(p-aminophenyl)benzimidazole. The polyimide copolymer obtained by polycondensation of these monomer components has a high adhesive strength by itself and can give a metal laminate with a satisfactory peel strength even if laminated directly to a metallic foil without interposing an adhesive layer therebetween, and also has a good solder heat resistance, but originally the polyimide copolymer has not been intended to lower the coefficient of linear thermal expansion or percent heat shrinkage or improvement of curling resistance.

DISCLOSURE OF THE INVENTION

An object of the present invention is to provide a polyimide copolymer capable of giving a flexible printed circuit board with satisfactory adhesive strength and dimensional stability in a metal laminate comprising one kind of polyimide copolymer layer formed on the metallic conductor, by lowering the coefficient of linear thermal expansion or percent heat shrinkage of the polyimide copolymer or approaching the coefficient of linear thermal expansion or percent heat shrinkage of the polyimide copolymer to that of the conductor, thereby effectively suppressing curling, twisting, warping, etc. of the metal laminate even if subjected to heat hysteresis, and also to provide a metal laminate using the same.

The object of the present invention can be attained by a novel polyimide copolymer, which is a copolymer comprising two kinds of tetracarboxylic acid dianhydrides consisting of (A) isopropylidenebis(4-phenyleneoxy-4-phthalic acid) dianhydride and (B) 3,3',4,4'-biphenyltetracarboxylic acid dianhydride, and one kind of a diamine consisting of (C) 6-amino-2-(p-aminophenyl)benzimidazole or two or three kinds of diamines consisting of said component (C) and (D) at least one kind of diamines consisting of bis(4-aminophenyl) ether ($D_1$) and phenylenediamine ($D_2$), and also by a metal laminate comprising a metallic foil and a layer of said polyimide copolymers laminated thereto. The present novel polyimide copolymer is film-formable.

Tetracarboxylic acid dianhydrides for use in the synthesis of the present novel polyimide copolymer are two kinds of acid dianhydrides consisting of (A) isopropylidenebis(4-phenylene-oxy-4-phthalic acid) dianhydride as shown below:

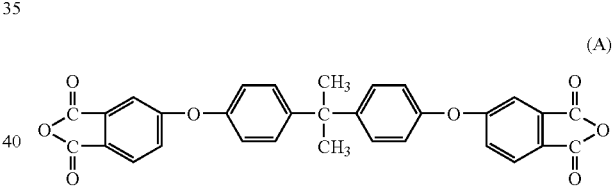

(A)

and (B) 3,3',4,4'-biphenyltetracarboxylic acid dianhydride as shown below:

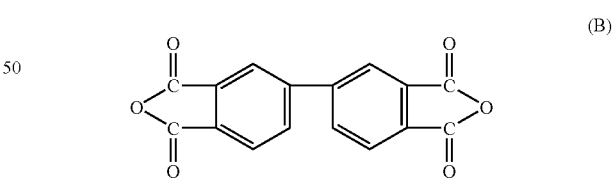

(B)

Component (A) and component (B) are used in a proportion of component (A) to component (B) of 10-80% by mole, preferably 20-60% by mole to 90-20% by mole, preferably 80-40% by mole. When a proportion of component (A) is more than 80% by mole, curling will be pronounced in the stage of forming a metal laminate, together with an increased coefficient of linear thermal expansion and also with an increased percent heat shrinkage. Whereas when a proportion of component (A) is less than 10% by mole, the resulting film will become not only brittle, but also the adhesive strength will be no more observable in the metal laminate.

Other kinds of tetracarboxylic acid dianhydrides can be used together within such a range as not to deteriorate the object of the present invention.

Diamine for use in forming a polyimide copolymer upon reaction with these two kinds of tetracarboxylic acid dianhydrides is (C) 6-amino-2-(p-aminophenyl) benzimidazole as shown below:

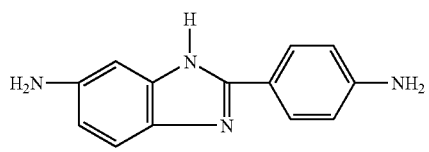
(C)

The above mentioned diamine compound (C) can be used together with (D) at least one of bis(4-aminophenyl)ether ($D_1$) and phenylenediamine, for example, p-phenylenediamine ($D_2$) as shown below:

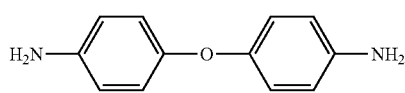
($D_1$)

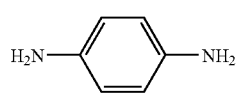
($D_2$)

When bis(4-aminophenyl)ether ($D_1$) is used as diamine compound (D), a proportion of component ($D_1$) to component (C) is not more than 40% by mole, preferably 30-10% by mole, to not less than 60% by mole, preferably 70-90% by mole. When a proportion of component ($D_1$) to component (C) is more than 40% by mole, curling will be pronounced in the stage of forming a metal laminate, together with an increased coefficient of linear thermal expansion.

When phenylenediamine ($D_2$) is used as diamine compound (D), a proportion of component ($D_2$) to component (C) is not more than 80% by mole, preferably 70-50% by mole to not less than 20% by mole, preferably 30-50% by mole. When a proportion of component ($D_2$) to component (C) is more than 80% by mole, curling will be pronounced in the stage of forming a metal laminate.

When bis(4-aminophenyl)ether ($D_1$) and phenylenediamine ($D_2$) are used together as diamine compounds (D), a proportion of sum total of components ($D_1$) and ($D_2$) to component (C) is generally not more than 75% by mole to not less than 25% by mole, though dependent on a proportion of diamine compound ($D_1$) to diamine compound ($D_2$), and component (C) and component (D) can be used in such a molar ratio as not to cause curling in the stage of forming a metal laminate.

Other kinds of diamine compounds can be used together in such a range as not to deteriorate the object of the present invention.

Reaction of tetracarboxylic acid dianhydrides with diamine(s) is carried out preferably in a N-methyl-2-pyrrolidone solvent, but can be carried out also in a polar solvent such as dimethylformamide, dimethyl-acetamide, m-cresol, etc. Actually, diamine (mixture) or its solution in a polar solvent is dropwise added to a solution in a polar solvent of tetracarboxylic acid dianhydride mixture at about 0°-about 60° C., and then subjected to reaction at about 0-about 60° C. for about 0.5-about 5 hours to form polyamic acid as a polyimide precursor copolymer.

The polyamic acid solution in a polar solvent is applied to a metallic foil, typically a copper foil, and after removal of the solvent by drying, polyimidization reaction is carried out by heating. To promote dehydration cyclization reaction for the polyimidization, the polyamic acid-applied metallic foil is passed through a drying oven heated to a temperature of about 150°-about 450° C., preferably about 200° C.-about 400° C., to form a metal laminate substantially free from the solvent. The polar solvent used in the synthesis reaction of polyimide precursor copolymer can be used as a polar solvent for the polyamic acid as such. N-methyl-2-pyrrolidone is a preferable polar solvent.

As a result of reaction between tetracarboxylic acid dianhydride (A) and diamine (C), a polyimide copolymer with the following repeat unit can be obtained:

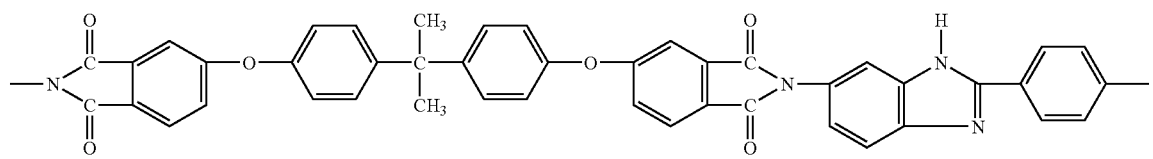

As a result of the reaction between the tetracarboxylic acid dianhydride (B) and the diamine (C), a polyimide copolymer with the following repeat unit can be obtained in addition to the above-mentioned repeat unit:

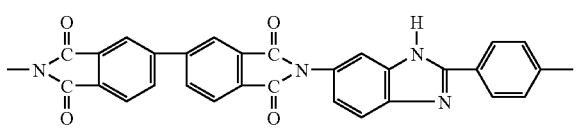

When diamine ($D_1$) is used together with diamine (C), a polyimide copolymer with the following repeat units can be obtained by reaction with the tetracarboxylic acid dianhydrides (A) and (B):

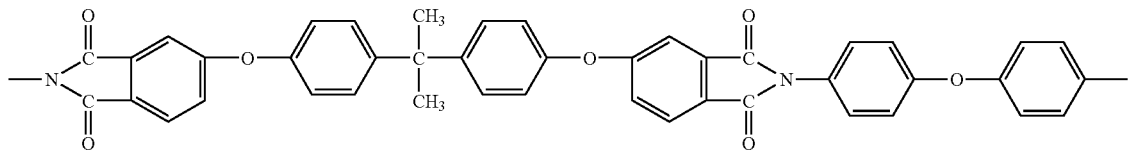

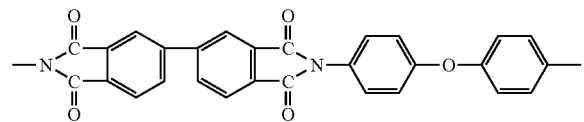

When diamine (D$_2$) is used together with diamine (C), a polyimide copolymer with the following repeat units can be obtained by reaction with the tetracarboxylic acid dianhydrides (A) and (B):

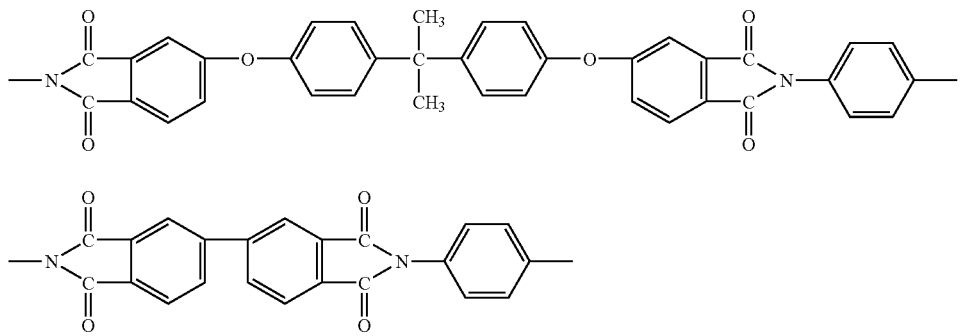

Polyimide copolymers having said repeat units are insoluble in various solvents and thus their molecular weights or viscosities cannot be determined or the ranges thereof cannot be specified, but it is certain that these polyimide copolymers have molecular weights necessary for enabling film formation. In the stage of polyamic acids which are deemed to be in a form of polyimide precursor copolymers, it is possible to determine a viscosity of a reaction mixture solution at a given concentration of solid matters, but the viscosity is of variable nature, e.g. dependent on reaction time, etc.

Polyimide copolymer obtained by polycondensation of isopropylidene-bis(4-phenyleneoxy-4-phthalic acid) dianhydride and 6-amino-2-(p-aminophenyl)benzimidazole, as disclosed in the afore-mentioned WO 01/29136, is soluble by itself in a solvent such as dimethyl formamide, dimethyl acetamide, N-methyl-2-pyrrolidone, m-cresol, etc., and when a solution of such a copolymer is applied to a metallic foil, a metal laminate with a satisfactory peel strength can be obtained.

On the other hand, the present polyimide copolymer obtained by using isopropylidenebis(4-phenyleneoxy-4-phthalic acid) dianhydride and 3,3',4,4'-biphenyltetracarboxylic acid dianhydride as acid dianhydrides to be polycondensated with 6-amino-2-(p-aminophenyl)benzimidazole is insoluble in various solvents, as mentioned above, and a metal laminate obtained by laminating the present polyimide copolymer to a metallic foil has a distinguished curling resistance and an improved coefficient of linear thermal expansion or percent heat shrinkage.

A polyimide copolymer film having a thickness of about 5-about 50 μm with good mechanical strength and thermal dimensional stability can be also obtained by removing the metallic foil from the thus formed metal laminate.

BEST MODES FOR CARRYING OUT THE INVENTION

The present invention will be described below, referring to Examples.

EXAMPLE 1

A solution containing 520.1 g (1.0 mole) of (A) isopropylidenebis(4-phenyleneoxy-4-phthalic acid) dianhydride and 294.0 g (1.0 mole) of (B) 3,3',4,4'-biphenyltetracarboxylic acid dianhydride in 7,150 ml of N-methyl-2-pyrrolidone was charged into a four-necked flask having a capacity of 10 L and provided with a stirrer in a nitrogen gas-flushed atmosphere, and then 448.0 g (2.0 moles) of (C) 6-amino-2-(p-aminophenyl)-benzimidazole was charged thereto, while keeping the temperature not higher than 60° C. The resulting mixture was stirred at room temperature for three hours to obtain 8,245 g of a varnish-state polyimide precursor copolymer solution (viscosity at 25° C.: 7,900 cps; concentration of solid matters: 15 wt. %).

The above-mentioned polyimide precursor copolymer solution was applied to a roughened surface of rolled electrolytic copper foil (product of Furukawa Electric Co., Ltd.; thickness: 10 μm) with a coat thickness of 18 μm using a reverse type roll coater, and then the solvent was continuously removed therefrom through a hot air drying oven at 120° C., followed by heat treatment by elevating the temperature up to 400° C. over 10 minutes to form a 12.5 μm-thick polyimide layer on the copper foil.

EXAMPLE 2

In Example 1, the amount of component (A) was changed to 260.0 g (0.5 moles), that of component (B) to 441.0 g (1.5 moles) and that of N-methyl-2-pyrrolidone to 6,510 ml, respectively, and 7,572 g of a varnish-state polyimide precursor copolymer solution (8,200 cps; 15 wt. %) was obtained. A polyimide-laminated copper foil was manufactured from the thus obtained polyimide precursor copolymer solution in the same manner as in Example 1.

EXAMPLE 3

In Example 2, the amount of N-methyl-2-pyrrolidone was changed to 6,520 ml and that of component (C) to 403.2 g (1.8 moles), respectively, while 40.0 g (0.2 moles) of $(D_1)$ bis(4-aminophenyl)ether was additional used. 7,470 g of a varnish-state polyimide precursor copolymer solution (5,500 cps; 15 wt. %) was obtained. A polyimide-laminated copper foil was manufactured from the thus obtained polyimide precursor copolymer solution in the same manner as in Example 1.

EXAMPLE 4

In Example 3, the amount of N-methyl-2-pyrrolidone was changed to 6,200 ml, that of component (C) to 313.6 g (1.4 moles) and that of component $(D_1)$ to 80.0 g (0.6 moles), respectively. 7,221 g of a varnish-state polyimide precursor copolymer solution (3,800 cps; 15 wt. %) was obtained. A polyimide-laminated copper foil was manufactured from the thus obtained polyimide precursor copolymer solution in the same manner as in Example 1.

The copper foil/polyimide laminates obtained in the foregoing Examples and polyimide films obtained by removing the copper foils from the laminates by etching were subjected to determination of the following items.

Glass transition temperature (Tg): Loss elastic modulus E" in terms of Pa unit was obtained from dynamic viscoelasticity determined by a dynamic viscoelasticity analyzer DMe 7e made by Parkin Elmer Co., Ltd. and maximum E" was made "Tg"

Coefficient of linear thermal expansion (100°-200° C.) (CTE): A film sample obtained from a laminate, 10 cm×10 cm, by etching, and stress relaxed by heating to 400° C. was fixed to a TMA tester and subjected to determination in a tensile mode under such conditions as load: 2 g, sample length: 20 mm and temperature elevation rate: 10° C./min Adhesive strength: A laminate, 1 cm×10 cm, was subjected to determination according to JIS C-6481

Tensile strength and elongation at break: A film obtained from a laminate, 10 cm×20 cm, by etching was subjected to determination according to ASTM D-882-83

Water absorbability: A film obtained from a laminate, 11 cm×11 cm, by etching was dried at 150° C. for 60 minutes (dry weight $W_1$) and then dipped in distilled water at 23° C. for 24 hours (after-dipping weight $W_2$), then determined as a change in weight by the equation of $(W_2-W_1) W_1 100$ Percent shrinkage after etching: Percent dimensional changes in MD direction and TD direction before and after etching were determined according to JIS C-6481

Percent heat shrinkage: A film obtained from a laminate, 10 cm×20 cm, by etching was subjected to heat treatment in a hot air oven at 150° C. for 30 minutes to determine percent dimensional changes in MD direction and TD direction before and after the heat treatment Curling: A laminate, 5 cm×5 cm, was gently placed on a horizontal flat base to bring the laminate into a concave state thereon, and the state was visually observed without applying any particular external force thereto Results of determination and observation are shown in the following Table 1.

TABLE 1

| Determination/observation item | Ex. 1 | Ex. 2 | Ex. 3 | Ex. 4 |
|---|---|---|---|---|
| Tg (° C.) | 306 | 323 | 318 | 301 |
| CTE (ppm/° C.) | 32 | 17 | 23 | 32 |
| Adhesive strength (Kg/cm) | 1.80 | 1.92 | 1.85 | 1.90 |
| Tensile strength (MPa) | 164 | 244 | 237 | 240 |
| Elongation at break (%) | 46 | 36 | 47 | 66 |
| Water absorbability (%) | 2.98 | 3.36 | 3.05 | 2.27 |
| Percent shrinkage after etching | | | | |
| MD direction (%) | −0.05 | 0.099 | 0.067 | −0.054 |
| TD direction (%) | −0.118 | 0.061 | 0.048 | −0.084 |
| Percent heat shrinkage | | | | |
| MD direction (%) | −0.165 | 0.121 | 0.037 | −0.086 |
| TD direction (%) | −0.181 | 0.05 | 0.013 | −0.107 |
| Curling | | | | |
| Laminate | flat | flat | flat | flat |

COMPARATIVE EXAMPLE 1

In Example 1, the amount of component (B) was changed to 588.0 g (2.0 moles) and that of N-methyl-2-pyrrolidone to 5,870 ml, respectively, without using component (A). 6,699 g of a varnish-state polyimide precursor copolymer solution (6,450 cps; 15 wt. %) was obtained. A polyimide-laminated copper foil was manufactured from the thus obtained polyimide precursor copolymer solution in the same manner as in Example 1.

COMPARATIVE EXAMPLE 2

In Example 1, the amount of component (A) was changed to 936.0 g (1.8 moles), that of component (B) to 58.8 g (0.2 moles) and that of N-methyl-2-pyrrolidone to 8,170 ml, respectively. 9,234 g of a varnish-state polyimide precursor copolymer solution (2,500 cps; 15 wt. %) was obtained. A polyimide-laminated copper foil was manufactured from the thus obtained polyimide precursor copolymer solution in the same manner as in Example 1.

COMPARATIVE EXAMPLE 3

In Example 3, the amount of N-methyl-2-pyrrolidone was changed to 6,400 ml, that of component (C) to 224.0 g (1.0 mole) and that of component $(D_1)$ to 200.0 g (1.0 mole), respectively. 7,375 g of a varnish-state polyimide precursor copolymer solution (2,700 cps; 15 wt. %) was obtained. A polyimide-laminated copper foil was manufactured from the thus obtained polyimide precursor copolymer solution in the same manner as in Example 1.

COMPARATIVE EXAMPLE 4

In Example 3, the amount of N-methyl-2-pyrrolidone was changed to 6,270 ml, that of component (C) to 44.8 g (0.2 moles) and that of component $(D_1)$ to 360.0 g (1.8 moles), respectively. 6,981 g of a varnish-state polyimide precursor copolymer solution (7,900 cps; 15 wt. %) was obtained. A polyimide-laminated copper foil was manufactured from the thus obtained polyimide precursor copolymer solution in the same manner as in Example 1.

The copper foil/polyimide laminates obtained in the foregoing Comparative Examples and polyimide films obtained by removing the copper foils from the laminates by etching were subjected to the same determination and observation as in Examples 1 to 4. Results of determination and observation are shown in the following Table 2. In Comparative Example 1, the film after etching was so brittle that determination of "percent shrinkage after etching" and "percent heat shrinkage" could not be determined.

TABLE 2

| Determination/observation item | Comp. Ex. 1 | Comp. Ex. 2 | Comp. Ex. 3 | Comp. Ex. 4 |
|---|---|---|---|---|
| Tg (° C.) | 341 | 301 | 276 | 266 |
| CTE (ppm/° C.) | 6.5 | 48 | 39 | 47 |
| Adhesive strength (Kg/cm) | 0.5 | — | — | — |
| Tensile strength (MPa) | 329 | 133 | 191 | 185 |
| Elongation at break (%) | 20 | 60 | 62 | 80 |
| Water absorbability (%) | 3.75 | 2.61 | 1.93 | 1.20 |
| Percent shrinkage after etching | | | | |
| MD direction (%) | — | −0.163 | −0.136 | −0.285 |
| TD direction (%) | — | −0.228 | −0.242 | −0.270 |
| Percent heat shrinkage | | | | |
| MD direction (%) | — | −0.404 | −0.237 | −0.401 |
| TD direction (%) | — | −0.411 | −0.346 | −0.495 |
| Curling | | | | |
| Laminate | large | large | large | large |

EXAMPLE 5

A solution containing 208.0 g (0.4 moles) of (A) isopropylidenebis(4-phenyleneoxy-4-phthalic acid) dianhydride and 470.4 g (1.6 moles) of (B) 3,3',4,4'-biphenyltetracarboxylic acid dianhydride in 5,460 ml of N-methyl-2-pyrrolidone was charged into a four-necked flask having a capacity of 10 L and provided with a stirrer in a nitrogen gas-flushed atmosphere, and a mixture consisting of 134.4 g (0.6 moles) of (C) 6-amino-2-(p-aminophenyl) benzimidazole and 152.2 g (1.4 moles) of $(D_2)$ p-phenylenediamine was added thereto, while keeping the temperature not higher than 30° C. Then, the resulting mixture was stirred at room temperature for three hours to obtain 6,420 g of a polyimide precursor copolymer solution (concentration of solid matters: 15 wt. %; viscosity at 25° C.: 2,150 cps).

The resulting polyimide precursor varnish was continuously applied to the roughened surface of a rolled electrolytic copper foil (thickness: 10 μm; a product made by the Furukawa Electric Co., Ltd.) with a coat thickness of 18 μm using a reverse type roll coater, and then the solvent was continuously removed therefrom through a hot air drying oven at 120° C., followed by heat treatment for polyimidization by elevating the temperature up to 400° C. over 10 minutes to obtain a copper foil/polyimide laminate with a 12.5 μm-thick polyimide layer and without any curling.

EXAMPLE 6

In Example 5, the amount of N-methyl-2-pyrrolidone was changed to 5,730 ml, that of component (C) to 224.0 g (1.0 mole) and that of component $(D_2)$ to 108.0 g (1.0 mole), respectively. 6,736 g of a polyimide precursor copolymer solution (concentration of solid matters: 15 wt. %; viscosity: 1,850 cps) was obtained. A curling-free copper foil/polyimide laminate was also manufactured from the thus obtained polyimide precursor varnish in the same manner as in Example 5.

EXAMPLE 7

In Example 5, the amount of component (A) was changed to 260.0 g (0.5 moles), that of component (B) to 441.0 g (1.5 moles), that of N-methyl-2-pyrrolidone to 5,720 ml, that of component (C) to 179.2 g (0.8 moles) and that of component $(D_2)$ to 129.2 g (1.2 moles), respectively. 6,723 g of a polyimide precursor copolymer solution (concentration of solid matters: 15 wt. %; viscosity: 2,180 cps) was obtained. A curling-free copper foil/polyimide laminate was also manufactured from the thus obtained polyimide precursor varnish in the same manner as in Example 5.

EXAMPLE 8

In Example 5, the amount of component (A) was changed to 260.0 g (0.5 moles), that of component (B) to 441.0 g (1.5 moles), that of N-methyl-2-pyrrolidone to 5,850 ml, that of component (C) to 224.0 g (1.0 mole) and that of component $(D_2)$ to 108.0 g (1.0 mole), respectively. 6,880 g of a polyimide precursor copolymer solution (concentration of solid matters: 15 wt. % viscosity: 2,300 cps) was obtained. A curling-free copper foil/polyimide laminate was also manufactured from the thus obtained polyimide precursor varnish in the same manner as in Example 5.

EXAMPLE 9

A solution containing 156.0 g (0.3 moles) of (A) isopropylidenebis(4-phenyleneoxy-4-phthalic acid) dianhydride and 500.0 g (1.7 moles) of (B) 3,3',4,4'-biphenyltetracarboxylic acid dianhydride in 5,800 ml of N-methyl-2-pyrrolidone was charged into a four-necked flask having a capacity of 10 L and provided with a stirrer in a nitrogen gas-flushed atmosphere, in a mixture consisting of 180.0 g (0.8 moles) of (C) 6-amino-2-(p-aminophenyl) benzimidazole, 120.0 g (0.6 moles) of $(D_1)$ bis(4-aminophenyl)ether and 64.0 g (0.6 moles) of $(D_2)$ p-phenylenediamine was added thereto, while keeping the temperature not higher than 30° C. The mixture was stirred at room temperature for three hours to obtain 6,800 g of a polyimide precursor copolymer solution (concentration of solid matters: 15 wt. %: viscosity at 25° C.: 5,500 cps). A curling-free copper foil/polyimide laminate was also manufactured from the thus obtained polyimide precursor varnish in the same manner as in Example 5.

COMPARATIVE EXAMPLE 5

In Example 5, the amount of component (B) was changed to 588.0 g (2.0 moles), that of N-methyl-2-pyrrolidone to 5,260 ml, that of component (C) to 134.4 g (0.6 moles) and that of component $(D_2)$ to 86.4 g (0.8 moles), respectively, without using component (A). 120.0 g (0.6 moles) of bis(4-aminophenyl)ether was further used. 6,182 g of a polyimide precursor copolymer solution (concentration of solid matters: 15 wt. %; viscosity 3,200 cps) was obtained. A copper foil/polyimide laminate was also manufactured from the thus obtained polyimide precursor varnish in the same manner as in Example 5.

COMPARATIVE EXAMPLE 6

In Example 5, the amount of N-methyl-2-pyrrolidone was changed to 5,060 ml and that of component ($D_2$) to 216.0 g (2.0 moles), respectively, without using component (C). 5,963 g of a polyimide precursor copolymer solution (concentration of solid matters: 15 wt. %; viscosity: 1,000 cps) was obtained. A copper foil/polyimide laminate was also manufactured from the thus obtained polyimide precursor varnish in the same manner as in Example 5.

The copper foil/polyimide laminates obtained in the foregoing Examples 5 to 9 and Comparative Example 5 and polyimide films obtained by removing the copper foils from the laminates by etching were subjected to the same determination and observation as in Examples 1 to 4. Determination of elastic modulus and evaluation of curling were carried out in the following manner:

Elastic modulus: Films obtained from laminates, 10 cm×20 cm, by etching were subjected to determination according to ASTM D-882-83

Curling: Laminates, 5 cm×5 cm, films obtained therefrom by etching and the same films subjected to heat treatment at 150° C. for one hour, were gently placed on a horizontal flat base to bring them into a concave state thereon, and the state was visually observed without applying any external force thereto Results of determination and observation are shown in the following Table 3. In Comparative Example 6, the film obtained by etching was broken, so that other items than adhesive strength (0.3 Kg/cm) could not be determined, and curling of the laminate itself was observed.

water absorbability, and thus can be used as a suitable for a flexible, finely printed circuit board requiring a high dimensional stability.

Furthermore, in the manufacture of a metal laminate by laminating a polyimide copolymer layer directly to a metallic foil without interposing an adhesive layer therebetween, it is not necessary to form a plurality of polyimide copolymer layers as in the prior art. In the present invention, a metal laminate with desired properties can be manufactured by a simple method, i.e. by forming a single polyimide copolymer layer on a metallic foil.

The invention claimed is:

1. A metal laminate manufactured by laminating a single layer of a polyimide copolymer to a metallic foil which metal laminate is subjected to an etching process to remove a portion of the metallic foil said etching process being conducted after the single layer of the polyimide copolymer is laminated to the metallic foil, said polyimide copolymer comprising two kinds of tetracarboxylic acid dianhydrides consisting of (A) isopropylidenebis (4- phenyleneoxy-4-phthalic acid) dianhydride and (B) 3,3',4,4'-biphenyltetracarboxylic acid dianhydride, and two or three kinds of diamines consisting of (C) 6-amino-2-(p-aminophenyl) benzimidazole and (D) at least one kind of diamines consisting of bis(4-amninophenyl) ether ($D_1$) and phenylenedianhifle ($D_2$) and said polyimide copolymer being resistant to curling resulting from the metal laminate etching process so that the resulting etched metal laminate is substantially curl-free.

2. A metal laminate according to claim 1, wherein the copolymer has a film formability.

TABLE 3

| Determination/observation item | Ex. 5 | Ex. 6 | Ex. 7 | Ex. 8 | Ex. 9 | Comp. Ex. 5 |
|---|---|---|---|---|---|---|
| Tg (° C.) | 312 | 330 | 311 | 321 | 304 | 329 |
| CTE (ppm/° C.) | 21 | 19 | 23 | 23 | 25 | 18 |
| Adhesive strength (Kg/cm) | 1.2 | 1.5 | 1.1 | 1.2 | 1.0 | 1.2 |
| Elastic modulus (GPa) | 4.8 | 3.8 | 4.2 | 3.9 | 4.2 | 4.1 |
| Tensile strength (MPa) | 256 | 204 | 202 | 193 | 198 | 239 |
| Elongation at break (%) | 47 | 30 | 38 | 32 | 48 | 42 |
| Water absorbability (%) | 2.3 | 3.0 | 2.3 | 2.8 | 2.1 | 3.0 |
| Percent shrinkage after etching | | | | | | |
| MD direction (%) | 0.049 | 0.085 | 0.023 | 0.043 | −0.013 | 0.069 |
| TD direction (%) | 0.060 | 0.109 | 0.035 | 0.049 | −0.011 | 0.076 |
| Percent heat shrinkage | | | | | | |
| MD direction (%) | 0.039 | 0.081 | −0.022 | 0.016 | −0.084 | 0.083 |
| TD direction (%) | 0.058 | 0.110 | −0.019 | 0.035 | −0.062 | 0.090 |
| Curling | | | | | | |
| Laminate | flat | flat | flat | flat | flat | a little curled |
| Film obtained by etching | flat | flat | flat | flat | flat | a little curled |
| Heat-treated film | flat | flat | flat | flat | flat | pencil state |

Note)
"Pencil state" means such a state that the film is curled and shrinked into a bar-like form

INDUSTRIAL UTILITY

A metal laminate manufactured by laminating the present novel polyimide copolymer to a metallic foil has a low curling susceptibility to cause curling, twisting, warping, etc. against temperature changes due to a low coefficient of linear thermal expansion of the polyimide copolymer, and also has satisfactory adhesiveness and thermal dimensional stability and a low 3. A metal laminate according to claim 1, wherein the two kinds of tetracarboxylic acid dianhydrides are used in a proportion of component (A) to component (B) of 10-80 mol % to 90-20 mol % and the diamines are used in a proportion of component (C) to component ($D_1$) of not less than 60 mol. % to not more than 40 mol. %.

4. A metal laminate according to claim 1, wherein the two kinds of tetracarboxylic acid dianhydrides are used in a proportion of component (A) to component (B) of 10-80 mol % to 90-20 mol. %, and the diamines are used in a proportion of component (C) to component ($D_2$) of not less than 20 mol. % to not more than 80 mol. %.

5. A metal laminate according to claim 1 for use as a flexible printed circuit board.

* * * * *

UNITED STATES PATENT AND TRADEMARK OFFICE
CERTIFICATE OF CORRECTION

| | | |
|---|---|---|
| PATENT NO. | : 7,459,216 B2 | Page 1 of 1 |
| APPLICATION NO. | : 10/815164 | |
| DATED | : December 2, 2008 | |
| INVENTOR(S) | : Min Zuo et al. | |

It is certified that error appears in the above-identified patent and that said Letters Patent is hereby corrected as shown below:

<u>In the Claims</u>

Claim 1, column 12, lines 22-23, the last word of line 22 hyphenated to line 23 should be changed from "dianby-dride" and replaced with --dianhy-dride--

Claim 1, column 12, line 26, should be changed from "($D_1$) and phenylenedianhifle..." and replaced with --($D_1$) and phenylenediamine...--

Signed and Sealed this
Fourth Day of October, 2011

David J. Kappos
*Director of the United States Patent and Trademark Office*